(12) United States Patent
Sprenger et al.

(10) Patent No.: US 9,483,126 B2
(45) Date of Patent: Nov. 1, 2016

(54) SMART VARIABLE TORQUE DISPLAY

(71) Applicant: Intel Corporation, Santa Clara, CA (US)

(72) Inventors: Mark E. Sprenger, Folsom, CA (US); Russell S. Aoki, Tacoma, WA (US); Paul J. Gwin, Orangevale, CA (US); Ralph V. Miele, DuPont, WA (US); Shawn McEuen, Portland, OR (US); Mark MacDonald, Beaverton, OR (US); David Pidwerbecki, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/155,272

(22) Filed: May 16, 2016

(65) Prior Publication Data

US 2016/0259369 A1    Sep. 8, 2016

Related U.S. Application Data

(63) Continuation of application No. 14/318,288, filed on Jun. 27, 2014, now Pat. No. 9,353,560.

(51) Int. Cl.
| | |
|---|---|
| *E05D 11/08* | (2006.01) |
| *H05K 5/02* | (2006.01) |
| *G06F 1/16* | (2006.01) |
| *G06F 3/033* | (2013.01) |

(52) U.S. Cl.
CPC ............... *G06F 3/033* (2013.01); *E05D 11/08* (2013.01); *G06F 1/1683* (2013.01)

(58) Field of Classification Search
CPC .............. H01L 2224/73253; G06F 1/1633; G06F 1/1656; G06F 1/1616; G06F 1/166; G06F 1/1681; H05K 5/0226; F28F 2280/105; F28F 9/002; Y10T 29/49135; Y10T 29/49144; Y10T 16/5402; B32B 2307/56; E05D 11/082; E05D 2011/085; E05D 2011/088; E05D 3/02; E05Y 2900/606
See application file for complete search history.

(56) References Cited

U.S. PATENT DOCUMENTS

| | | | |
|---|---|---|---|
| 6,379,393 B1 | 4/2002 | Mavroidis et al. | |
| 6,812,624 B1 | 11/2004 | Pei et al. | |
| 7,064,472 B2 | 6/2006 | Pelrine et al. | |
| 8,183,739 B2 | 5/2012 | Heim | |
| 9,170,650 B2 | 10/2015 | Ramstein et al. | |
| 2004/0074069 A1 | 4/2004 | Browne et al. | |
| 2004/0217671 A1 | 11/2004 | Rosenthal et al. | |
| 2007/0286556 A1 | 12/2007 | Kassamakov et al. | |
| 2009/0132093 A1* | 5/2009 | Arneson | G06F 1/1616 700/282 |
| 2009/0184923 A1* | 7/2009 | Schena | G01D 7/007 345/156 |
| 2010/0051846 A1 | 3/2010 | Aoki et al. | |
| 2010/0226075 A1* | 9/2010 | Jahge | G06F 1/1664 361/679.01 |
| 2011/0241758 A1 | 10/2011 | Futter et al. | |

(Continued)

*Primary Examiner* — Courtney Smith
*Assistant Examiner* — Michael Matey
(74) *Attorney, Agent, or Firm* — Alpine Technology Law Group LLC

(57) ABSTRACT

In one example an electronic device comprises a controller, a chassis comprising a first section and a second section, and a hinge assembly to connect the first section of the chassis to the second section of the chassis comprising a shaft rotatable about a first axis, a brake selectively engageable with a portion of the shaft, and an electroactive polymer (EAP) actuator coupled to the brake, wherein the EAP actuator selectively engages the brake with a portion of the shaft in response to a signal from the controller. Other examples may be described.

18 Claims, 11 Drawing Sheets

(56) References Cited

U.S. PATENT DOCUMENTS

2011/0249042 A1* 10/2011 Yamamoto ............. G09G 3/342
                                                      345/690
2012/0022530 A1   1/2012 Woodruff et al.
2012/0169184 A1   7/2012 Pelrine et al.
2015/0001368 A1*  1/2015 Sprenger ................ G06F 1/166
                                                      248/550

* cited by examiner

SMART VARIABLE TORQUE DISPLAY

RELATED APPLICATIONS

This application is a continuation under 35 U.S.C. §120 of U.S. patent application Ser. No. 14/318,288, entitled SMART VARIABLE TORQUE DISPLAY, filed Jun. 27, 2014, the entire contents of which are hereby incorporated by reference.

BACKGROUND

The subject matter described herein relates generally to the field of electronic devices and more particularly to a smart variable torque display in electronic devices.

Electronic devices such as laptop computers, notebook computers, and the like comprise displays which are commonly coupled to a base section by a hinge assembly. Most existing hinge assemblies provide a constant torque required to open and close the hinge. Accordingly additional hinge configurations may find utility.

BRIEF DESCRIPTION OF THE DRAWINGS

The detailed description is described with reference to the accompanying figures.

DETAILED DESCRIPTION

Described herein are exemplary systems and methods to implement a smart variable torque display in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to provide electronic device displays with a smart variable torque display. The subject matter described herein addresses these and other issues by providing a hinge assembly which incorporates a brake selectively engageable with a shaft and an electroactive polymer (EAP) structure coupled to the brake. The EAP structure may be activated in response to signals from a controller which may be coupled to the hinge assembly in order to selectively engage the brake with a portion of the shaft. In some examples the hinge assembly may include a rotational position sensor to determine a rotational position of the shaft and a torque sensor to determine a torque level of the shaft. In some examples the torque sensor may determine a torque measurement from the voltage applied to the EAP structure, Thus, the EAP provides an active feedback loop by measuring the time rate of change of power across the EAP structure. In such examples the controller may include logic to receive input signals from the rotational position sensor and the torque sensor and, in response to the signals, to vary the pressure applied by the EAP structure at different rotational positions. In further examples controller may be configured with a predetermined rotational resistance (i.e., torque) profile over a degree of rotation of the display and may apply activate the EAP structure to generate a torque that corresponds to the predetermined rotational profile.

Further structural and operational details will be described with reference to FIGS. 1-10, below.

Figure 1:
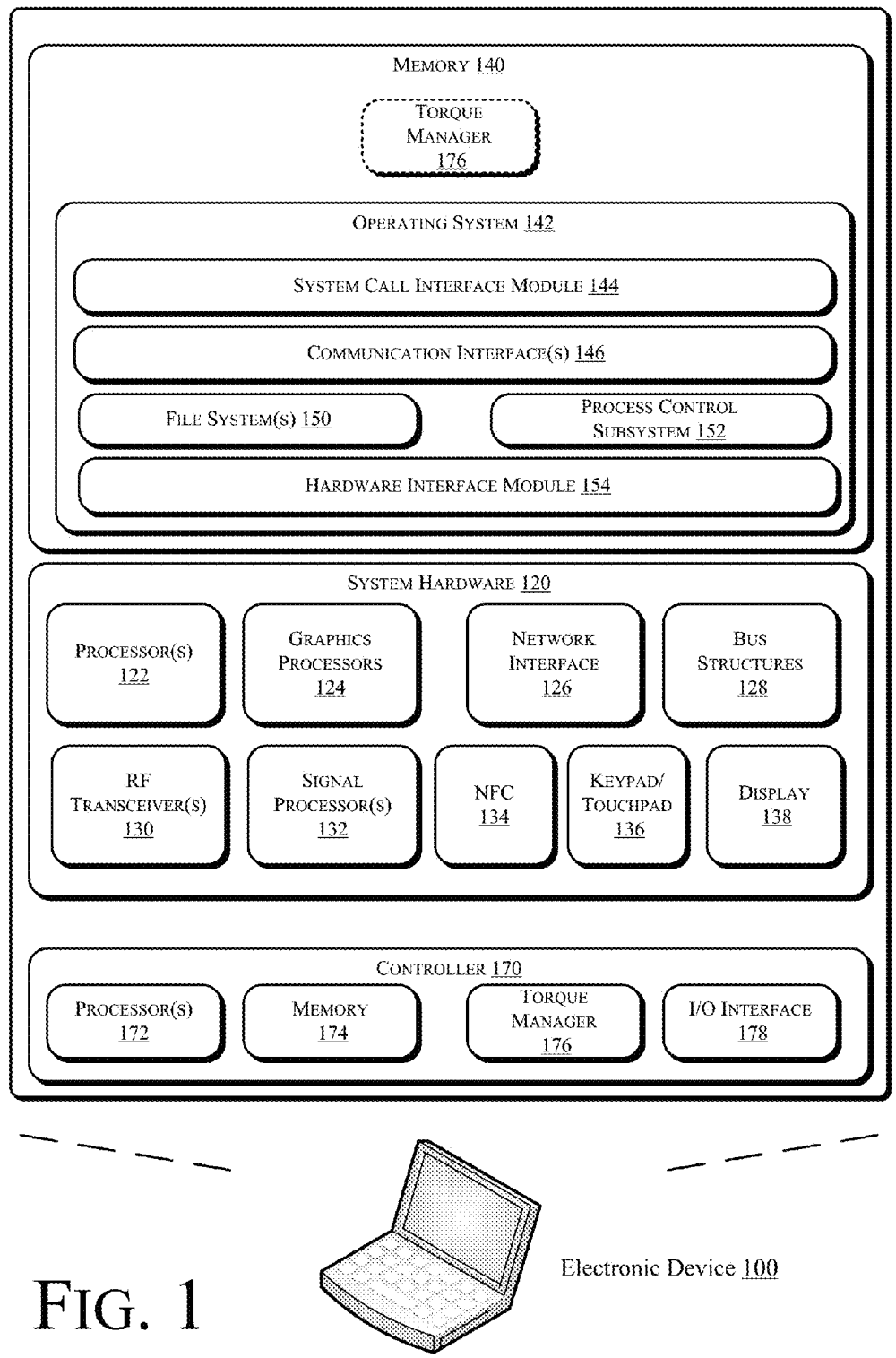
FIG. 1 is a schematic illustration of an electronic device which may be adapted to implement a smart variable torque display in accordance with some examples.

FIG. 1 is a schematic illustration of an electronic device 100 which may be adapted to implement a smart variable torque display in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one example, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one example, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one example, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more input/output interfaces such as, e.g., a keypad 136 and a display 138. In some examples electronic device 100 may not have a keypad and use the touch panel for input.

Memory 140 may include an operating system 142 for managing operations of electronic device 100. In one example, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms In the example depicted in FIG. 1 the controller 170 comprises a processor 172, a memory module 174, a torque manager 176, and an I/O interface 178. In some examples the memory module 174 may comprise a persistent flash memory module and the various functional modules may be implemented as logic instructions encoded in the persistent memory module, e.g., firmware or software. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122. In some examples the torque manager 176 may reside in the memory 140 of electronic device 100 and may be executable on one or more of the processors 122.

In some examples the electronic device 100 may comprise a hinge assembly which includes a shaft rotatable about a first axis, a brake selectively engageable with a portion of the shaft and an electroactive polymer (EAP) actuator coupled to the brake such that the EAP actuator selectively engages the brake with a portion of the shaft in response to a signal from a controller. FIGS. 2A-2E are schematic, cross-sectional illustrations of examples of such hinge assemblies.

Figure 2A:
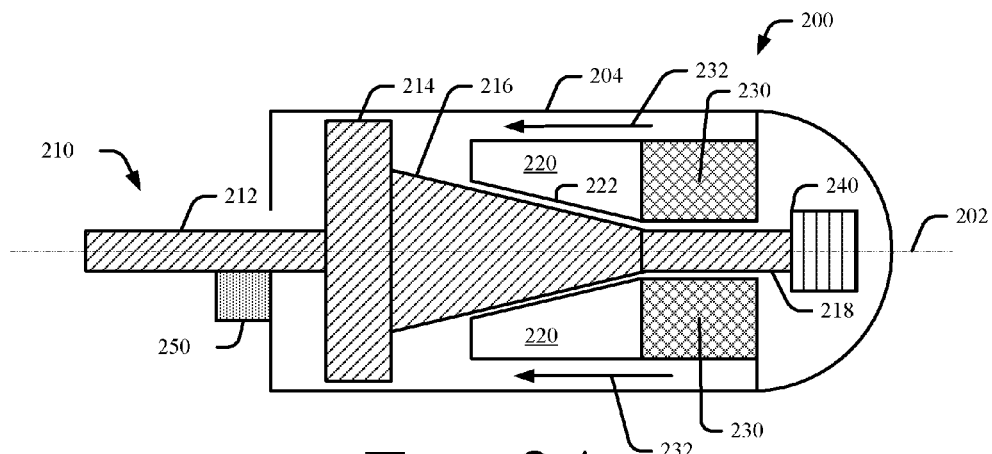
FIGS. 2A-2E are schematic cross-sectional illustrations of components of a smart variable torque display in accordance with examples.

Referring first to FIG. 2A, in some examples the hinge assembly 200 comprises a housing 204 and a shaft 210 extending through a portion of the housing 204 and rotatable about a first axis 202. Shaft 210 includes a first portion 212 having a first diameter and a second portion 214 having a second diameter. A third portion 216 abuts the second portion and is a frustoconical in shape when viewed as a cross section. A fourth portion 218 abuts the third portion 216. Shaft 210 may be formed from a suitably rigid material, e.g., a metal, alloy, or polymer.

A brake 220 is positioned proximate the third portion 216 of the shaft 210. In the example depicted in FIG. 2A the brake 220 is also frustoconical in shape when viewed in cross section such that an interior edge 222 of the brake is positioned to mate with the third portion 216 of the shaft. Brake 220 may be formed from a suitably rigid material, e.g., a carbon-based material or a graphite-based material.

An electroactive polymer (EAP) actuator 230 is positioned proximate one end of the brake 220. EAP actuator 230 may be formed from a suitable electroactive polymer material. Example of suitable materials include dielectric polymers, ferroelectric polymers, electrostrictve graft polymers, liquid crystalline polymers, and ionic polymers.

A rotational position sensor 240 may be positioned adjacent the fourth section 218 of shaft 210 to detect a rotational position of shaft 210 relative to a starting position. In some examples the rotational position sensor 240 may be implemented using a capacitive sensor which senses a change in capacitance of a capacitive element when the materials are distorted by application of a force. A wiper is positioned on an interior portion of the capacitive sensing device. As the shaft rotates it comes in contact with strips of capacitive material. When the wiper bears down on the capacitive sensing polymer the device 240 detects the strip and the angle of rotation can be determined.

A torque sensor 250 may be positioned proximate a section of the shaft 210 to detect the torque on the shaft 210. For example, the torque sensor 250 may be a strain gauge or the like.

In operation, when an electrical charge is applied to EAP actuator 230, the EAP actuator expands which drives the brake 220 in a direction indicated by arrows 232 which, in turn, causes the interior edge 222 of the brake to apply a pressure to the third section 216 of the shaft, thereby increasing a rotational resistance of the shaft 210.

Figure 2B:
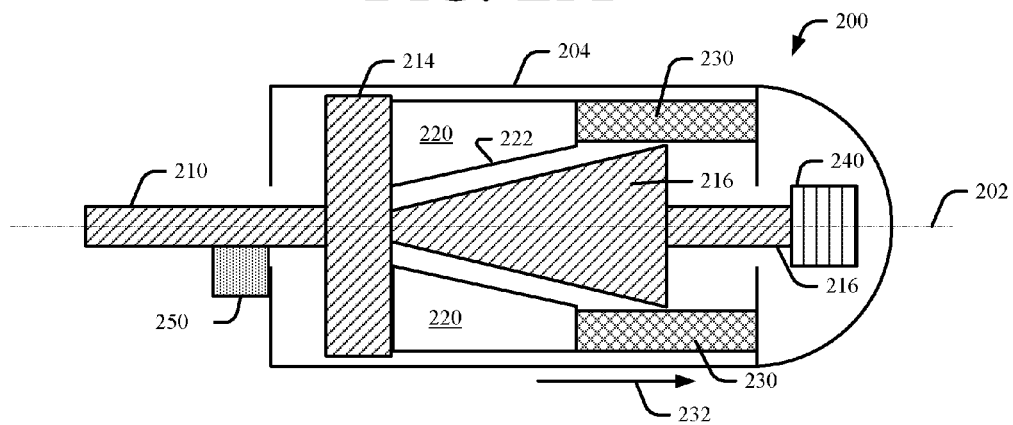

FIG. 2B is another example of a hinge assembly 200. The example depicted in FIG. 2B includes many of the same components as the example described with reference to FIG. 2A, and for the sake of brevity and clarity the description like structures will not be repeated. In the example depicted in FIG. 2B the orientation of the third section 216 of shaft 210 and the orientation of the brake 220 are reversed. In operation, when an electrical charge is applied to EAP actuator 230, the EAP actuator contracts which pulls the brake 220 in a direction indicated by arrow 232 which, in turn, causes the interior edge 222 of the brake to apply a pressure to the third section 216 of the shaft, thereby increasing a rotational resistance of the shaft 210.

Figure 2C:
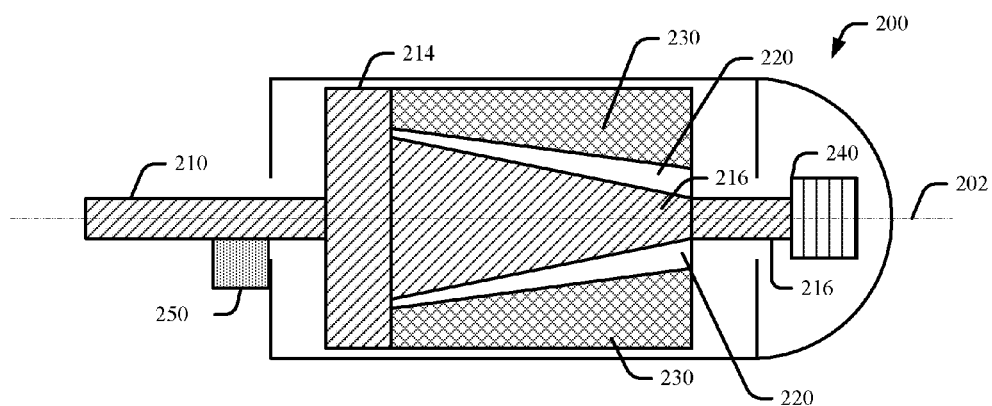

FIG. 2C is another example of a hinge assembly 200. The example depicted in FIG. 2B includes many of the same components as the example described with reference to FIG. 2A, and for the sake of brevity and clarity the description like structures will not be repeated. In the example depicted in FIG. 2B the orientation of brake 220 disposed between EAP actuator 230 and the third section 216 of shaft 210 is reversed. In operation, when an electrical charge is applied to EAP actuator 230, the EAP actuator contracts which compresses the brake 220 against the third section of the shaft 210, thereby increasing a rotational resistance of the shaft 210.

Figure 2D:
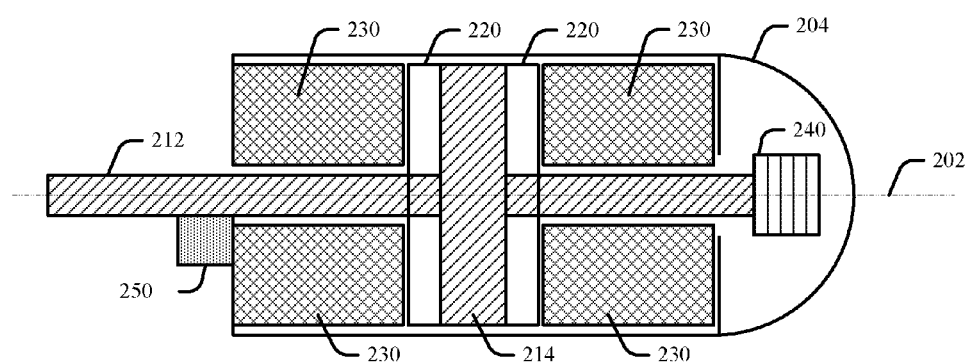

FIG. 2D is another example of a hinge assembly 200 which functions analogous to a disk brake system. The example depicted in FIG. 2D includes many of the same components as the example described with reference to FIG. 2A, and for the sake of brevity and clarity the description like structures will not be repeated. In the example depicted in FIG. 2D two brakes 220 are disposed on opposing sides of the second section 214 of shaft 210. In operation, when an electrical charge is applied to EAP actuators 230, the EAP actuators 230 expand which pushes the brakes 220 against the second section 214 of the shaft, thereby increasing a rotational resistance of the shaft 210.

Figure 2E:
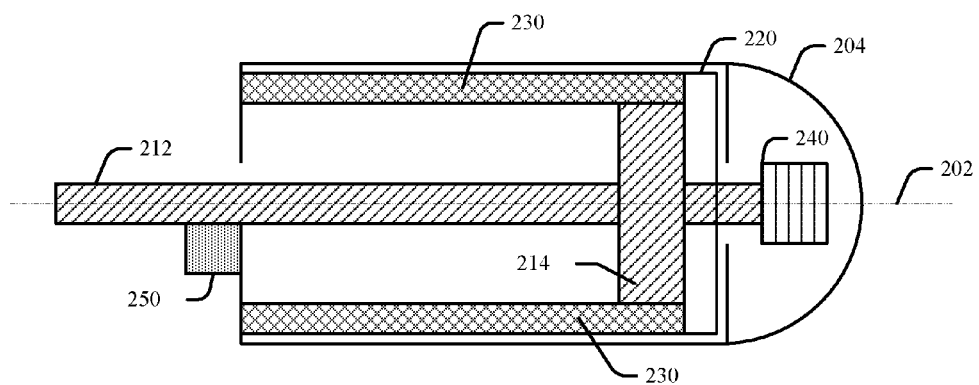

FIG. 2E is another example of a hinge assembly 200 which functions analogous to a disk brake system. The example depicted in FIG. 2E includes many of the same components as the example described with reference to FIG. 2A, and for the sake of brevity and clarity the description like structures will not be repeated. In the example depicted in FIG. 2E a brake 220 is disposed on one side of the second section 214 of shaft 210. In operation, when an electrical charge is applied to EAP actuator 230, the EAP actuator 230 contracts which pulls the brake 220 against the second section 214 of the shaft, thereby increasing a rotational resistance of the shaft 210.

Figure 3:
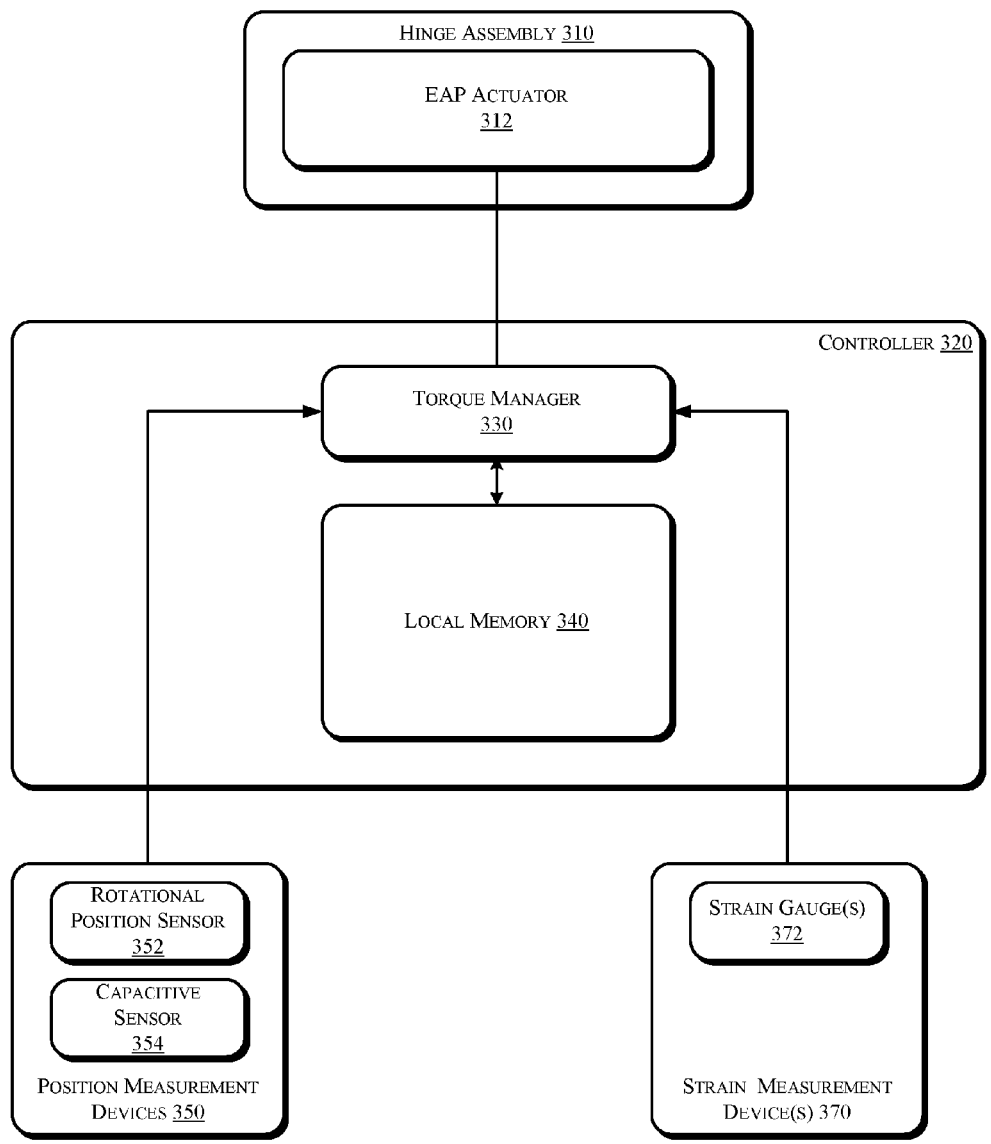
FIG. 3 is a high-level schematic illustration of an exemplary architecture to implement a smart variable torque display in accordance with some examples.

In some examples the torque manager 176 interacts with one or more other components of the hinge assembly to implement a smart variable torque display on the electronic device 100. FIG. 3 is a high-level schematic illustration of an exemplary architecture 300 to implement smart variable torque display in electronic devices. Referring to FIG. 3, a controller 320 may be embodied as general purpose processor 122 or as a low-power controller such as controllers 170. Controller 320 may comprise a torque manager 330 to manage a torque profile for the hinge assembly 200 and a local memory 340. As described above, in some examples the torque manager 330 may be implemented as logic instructions executable on controller 320, e.g., as software or firmware, or may be reduced to hardwired logic circuits. Local memory 340 may be implemented using volatile and/or non-volatile memory.

Controller 320 may be communicatively coupled to one or more local position measurement devices 350 which provide signals that indicate a rotational position of the hinge assembly in the electronic device. For example, position measurement devices 350 may include one or more rotational position sensors 352, or capacitive sensors 354. Controller 320 may also be communicatively coupled to one or more strain measurement devices 370, which may include strain gauge(s) 372. Torque manager 330 may also be coupled to an EAP actuator(s) 312 on a hinge assembly 310.

Having described various structures of a system to implement a smart variable torque display in electronic devices, operating aspects of a system will be explained with reference to FIGS. 4A, 4B, which are flow charts illustrating operations in a method to implement a smart variable torque display in electronic devices. The operations depicted in the flowcharts of FIGS. 4A and 4B may be implemented by the torque manager 330, alone or in combination with other component of electronic device 100.

Figure 4A:
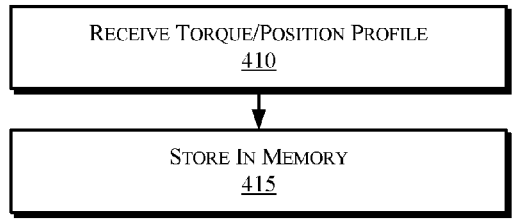
FIGS. 4A-4B are flowcharts illustrating operations in a method to implement a smart variable torque display in accordance with some examples.

Referring first to FIG. 4A, which depicts operations performed during a calibration procedure, at operation 410 the smart display manager 330 receives a torque/position profile which characterizes a desired level of torque for the hinge assembly at different rotational positions. At operation 415 the torque/position profile is stored in a memory, e.g., local memory 340.

Thus, the operations depicted in FIG. 4A enable the torque manager 330 to construct a data table in memory 340 which logs a target torque value for the hinge assembly (or assemblies) in various rotational positions. In operation, the controller 340 may receive the rotational position of the hinge and the strain measurements measured by strain gauge(s) 250 as the electronic device 100 is being opened and closed and actuate the EAP actuator 230 to adjust the pressure of the brake 220 on the shaft 210 in order to approximate the target torque value at the detected rotational position.

Figure 4B:
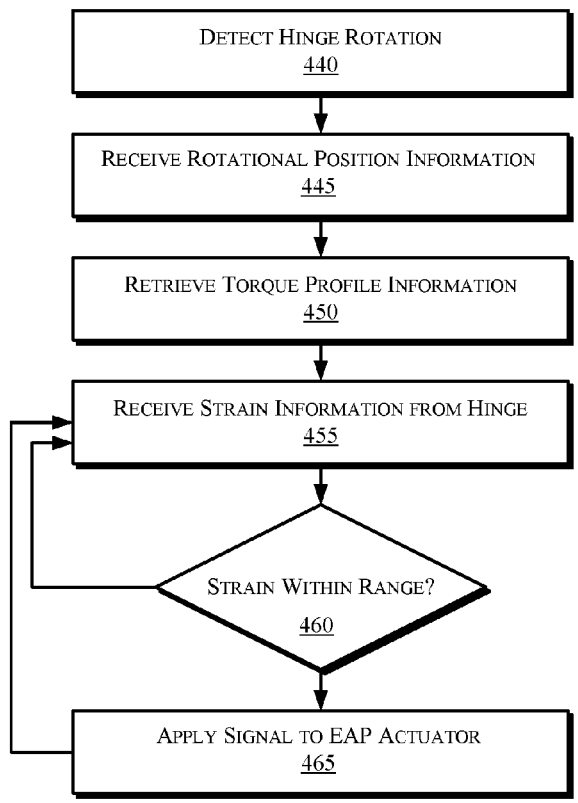

Referring to FIG. 4B, at operation 440 the torque manager 330 detects a hinge rotation. For example, the torque manager 330 may monitor one or more of the position measurement devices 350 to detect whether a hinge rotation.

At operation 445 the torque manager 330 receives rotational position information from one or more of the position measurement devices 350 to detect a hinge rotation At operation 450 the torque manager 330 retrieves torque profile information. For example, the torque manager 330 may retrieve the torque/position profile for the hinge assembly which was stored in memory 340.

At operation 455 the torque manager 330 receives strain information from the hinge assembly. For example, the smart display manager 330 may monitor the strain gauge(s) 250 as the display electronic device is being opened or closed.

If, at operation 460 the strain information from the strain gauges indicates that the torque at the hinge assembly 200 is within range of the strain in the torque/position profile then control passes back to operation 455 and the torque manager 330 continues to monitor the strain information from the hinge assembly or assemblies. By contrast, if at operation 460 the strain is not within range of the strain in the torque/position profile then control passes to operation 465 and the torque manager 330 applies a signal to the EAP actuator 230. For example, if the strain gauge indicates that the torque is too low then the EAP actuator 230 may be activated to increase the torque on the hinge assembly 200. By contrast, if the strain gauge indicates that the torque is too low then the EAP actuator 230 may be activated to increase the torque on the hinge assembly 200.

Thus, the operations depicted in FIG. 4B enable the torque manager 330 to monitor strain measurements measured by strain gauge(s) 250 as the size of the display is opened or closed and to adjust the torque on the hinge assembly 200 to meet a torque/position profile.

Figure 5:
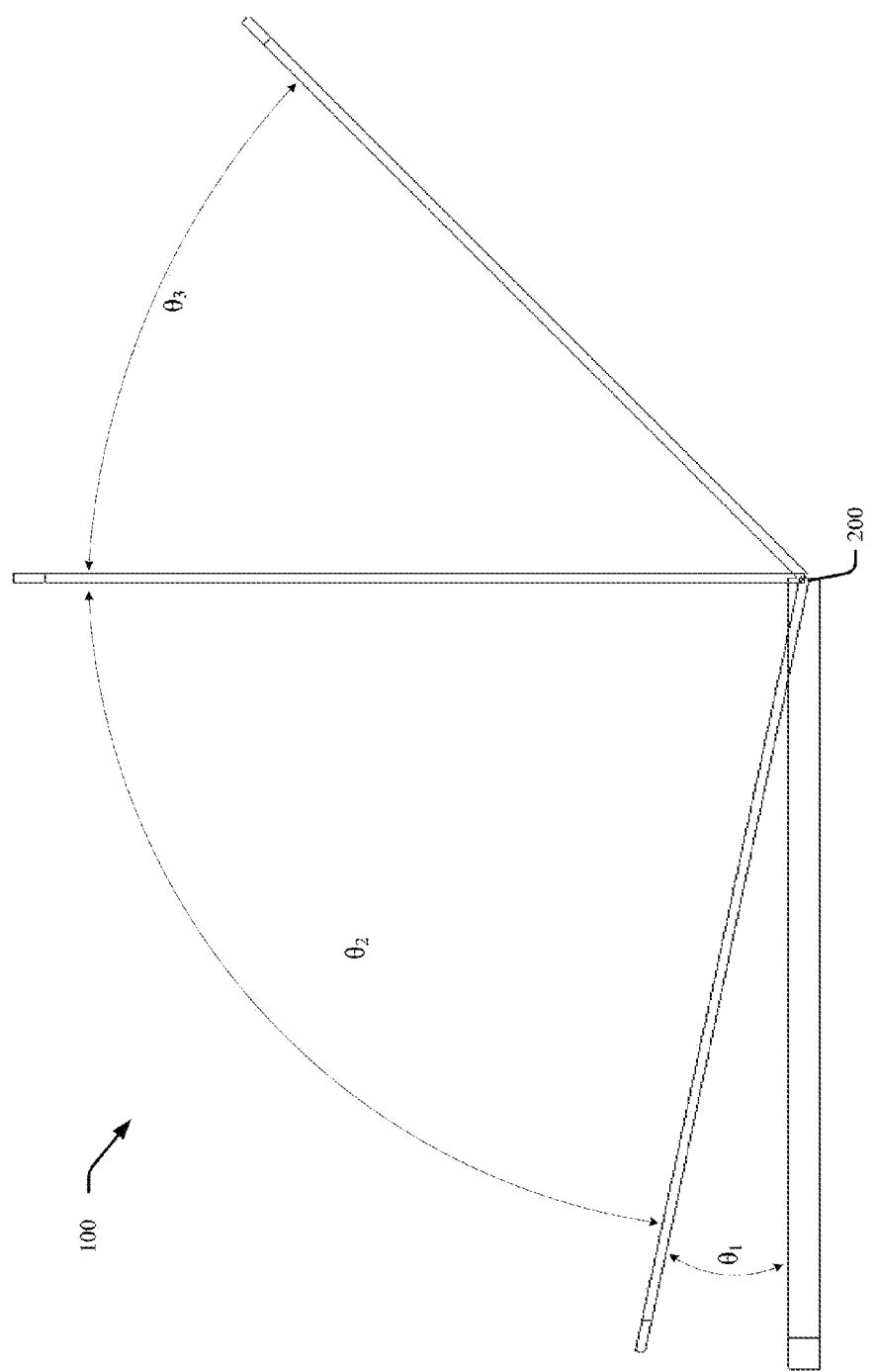
FIG. 5 is a schematic illustration of an electronic device which incorporates a smart variable torque display in accordance with some examples.

As illustrated in FIG. 5, the hinge assembly 200 enables an electronic device 100 to have a variable torque within different angular ranges of opening and/or closing. For example, the electronic device may have a first torque within a first angular range, a second torque within a second angular range, and a third torque within a third angular range. Alternatively, or in addition, the electronic device may have different torque values for opening the device and closing the device.

Figure 6:
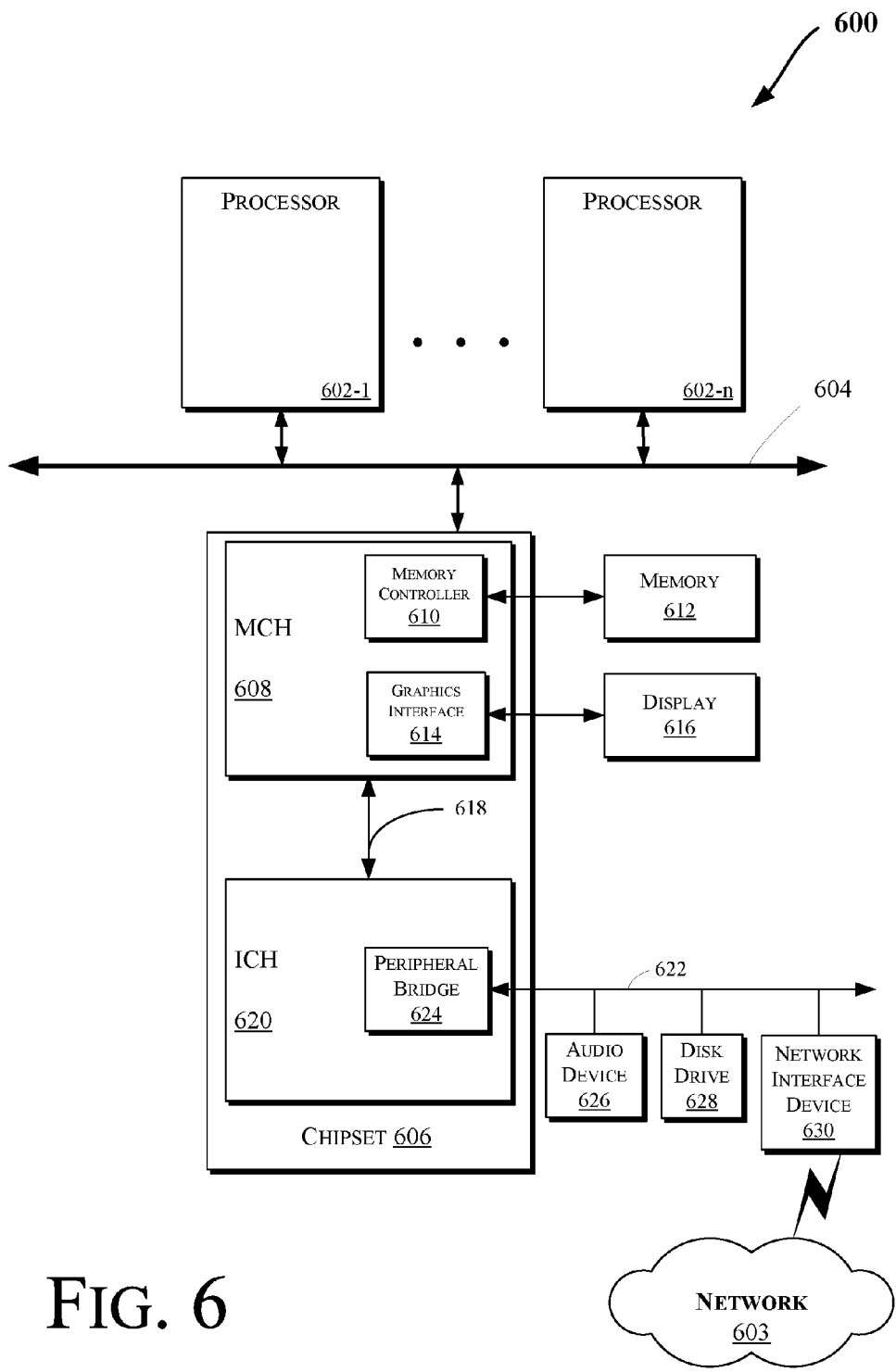
FIGS. 6-10 are schematic illustrations of electronic devices which may be adapted to implement a smart variable torque display in accordance with some examples.

As described above, in some examples the electronic device may be embodied as a computer system. FIG. 6 illustrates a block diagram of a computing system 600 in accordance with an example. The computing system 600 may include one or more central processing units 602-1 through 602-N (generally referred to herein as "processors 602": or "processor 602") that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors.

A chipset 606 may also communicate with the interconnection network 604. The chipset 606 may include a memory control hub (MCH) 608. The MCH 608 may include a memory controller 610 that communicates with a memory 612 (which may be the same or similar to the memory 174 of FIG. 1). The memory 612 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)).

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
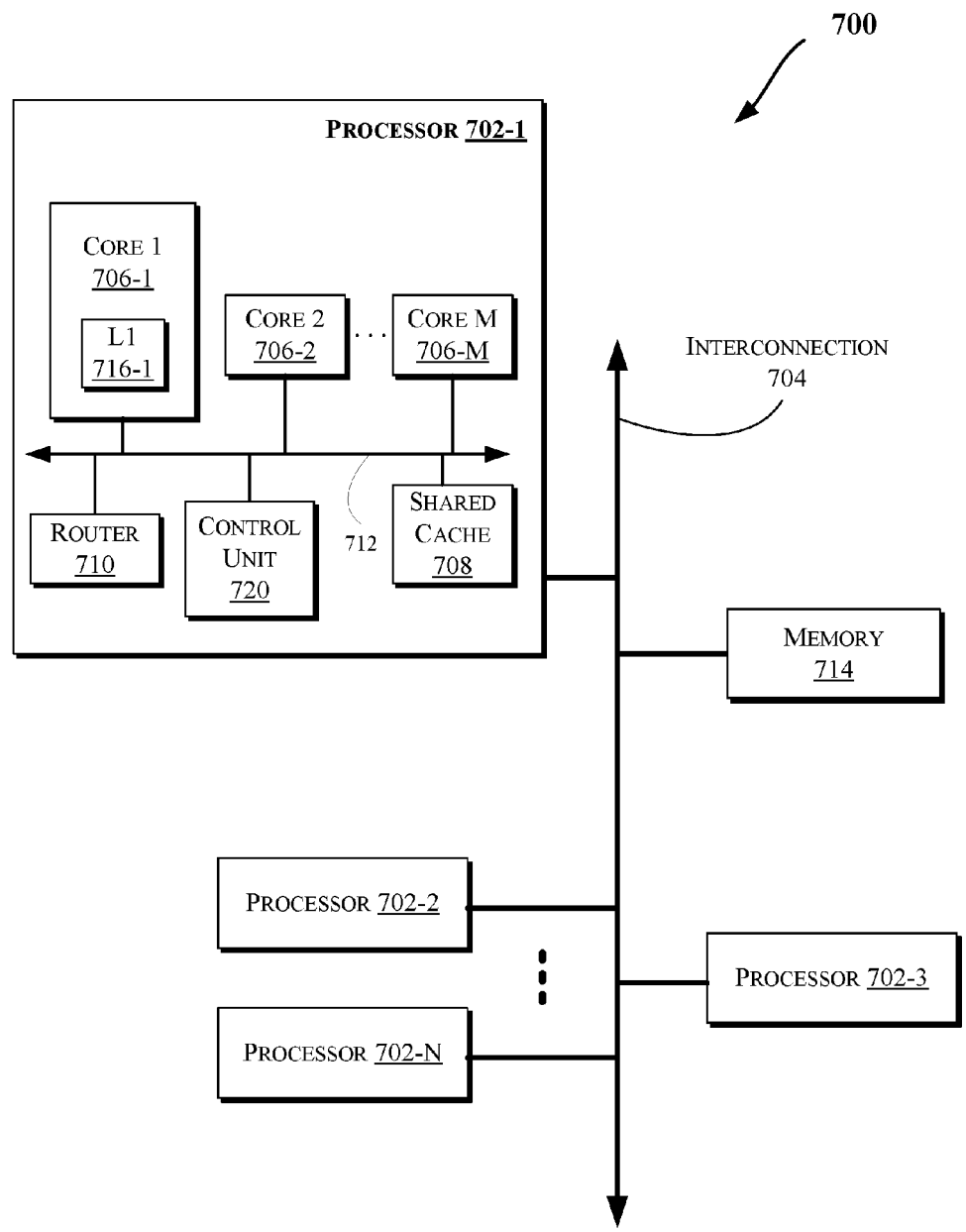

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the shared cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub.

Figure 8:
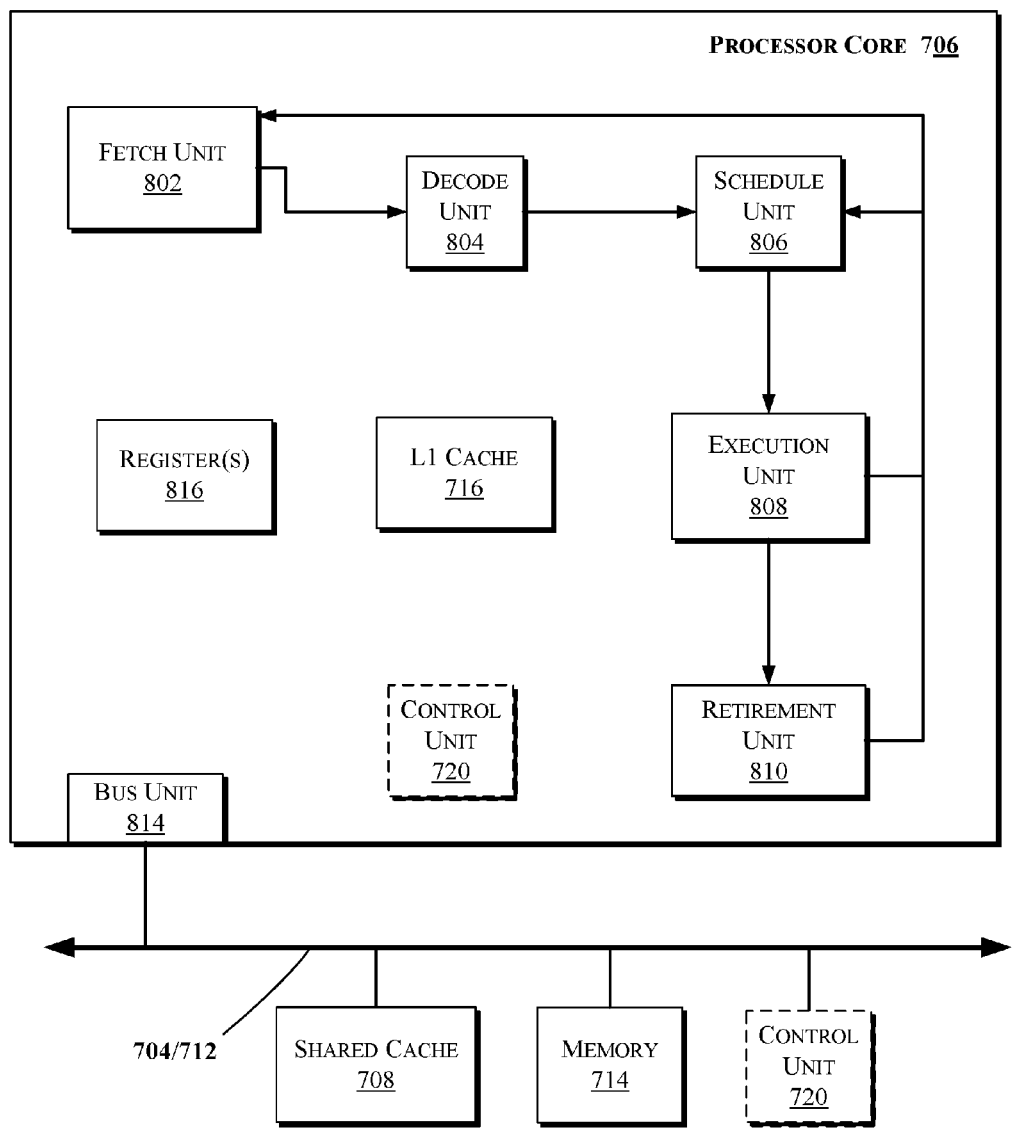

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of micro-operations.

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 814 to enable communication between components of the processor core 706 and other components (such as the components discussed with reference to FIG. 8) via one or more buses (e.g., buses 704 and/or 712). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 712, in various examples the control unit 720 may be located elsewhere such as inside the core 706, coupled to the core via bus 704, etc.

Figure 9:
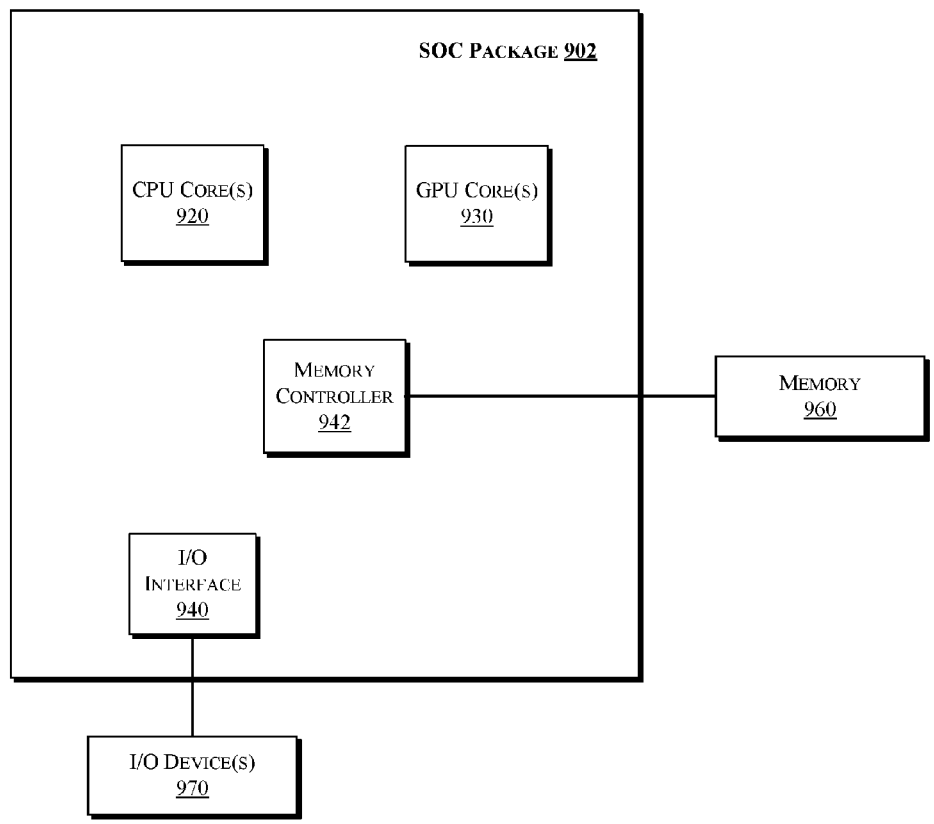

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
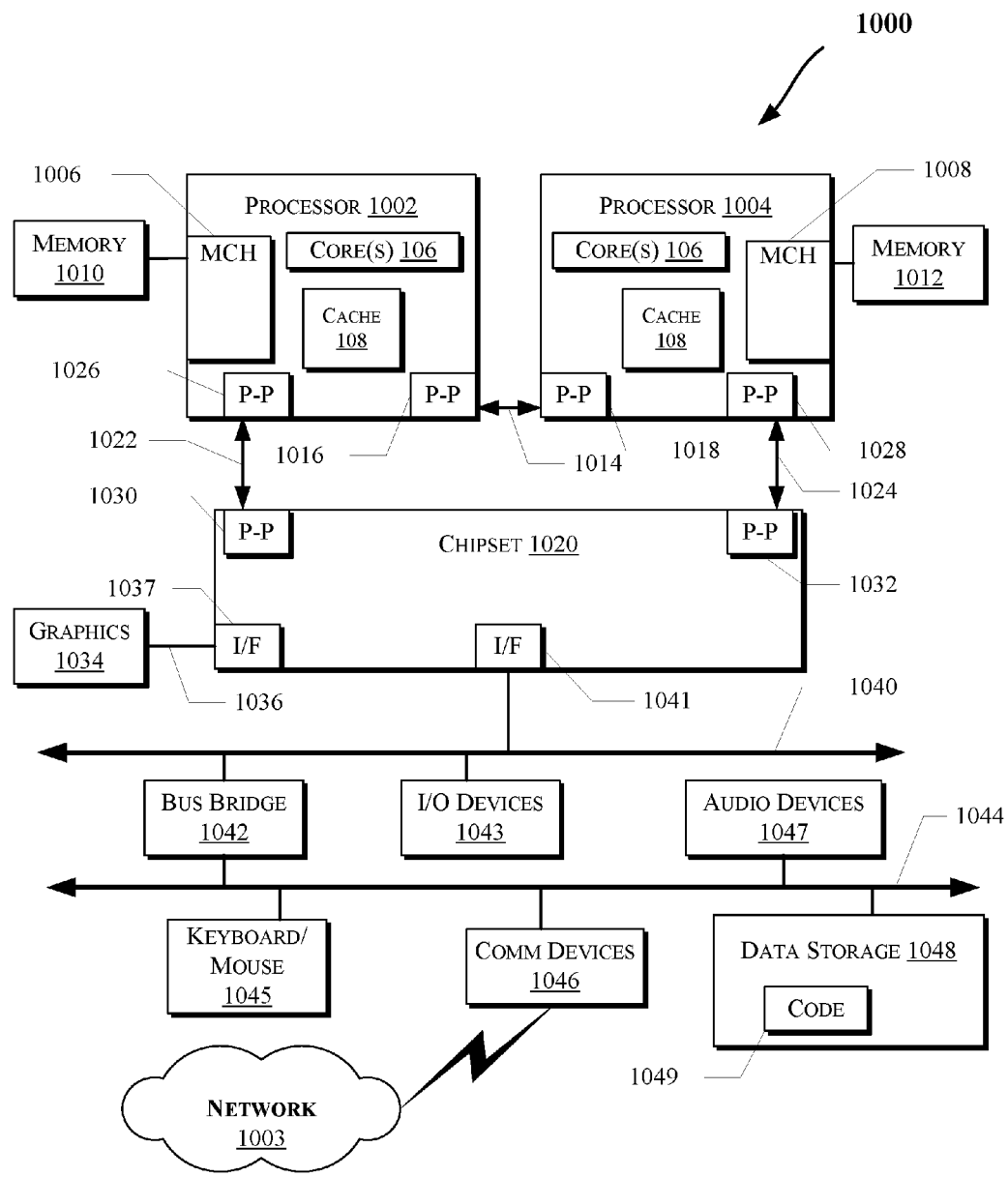

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset

1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following examples pertain to further examples.

Example 1 is a hinge assembly for an electronic device comprising a shaft rotatable about a first axis, a brake selectively engageable with a portion of the shaft, and an electroactive polymer (EAP) actuator coupled to the brake, wherein the EAP actuator selectively engages the brake with a portion of the shaft in response to a signal from a controller.

In Example 2, the subject matter of Example 1 can optionally include an arrangement in which the EAP actuator applies a pressure to the brake which varies across a range of angular rotation.

In Example 3, the subject matter of any one of Examples 1-2 can optionally include an arrangement in which the EAP actuator varies the pressure applied to the brake to achieve a predetermined torque profile across the range of angular rotation.

In Example 4, the subject matter of any one of Examples 1-3 can optionally include a rotational position sensor to determine a rotational position of the hinge assembly.

In Example 5, the subject matter of any one of Examples 1-4 can optionally include a sensor to determine a torque level of the hinge assembly.

In Example 6, the subject matter of any one of Examples 1-5 can optionally include an arrangement in which the EAP actuator expands in response to the signal to the signal from the controller.

In Example 7, the subject matter of any one of Examples 1-6 can optionally include an arrangement in which the EAP actuator contracts in response to the signal to the signal from the controller.

Example 8 is a chassis for an electronic device, comprising a first section and a second section and a hinge assembly to connect the first section of the chassis to the second section of the chassis, comprising a shaft rotatable about a first axis, a brake selectively engageable with a portion of the shaft, and an electroactive polymer (EAP) actuator coupled to the brake, wherein the EAP actuator selectively engages the brake with a portion of the shaft in response to a signal from a controller.

In Example 9, the subject matter of Example 8 can optionally include an arrangement in which the EAP actuator applies a pressure to the brake which varies across a range of angular rotation.

In Example 10, the subject matter of any one of Examples 8-9 can optionally include an arrangement in which the EAP actuator varies the pressure applied to the brake to achieve a predetermined torque profile across the range of angular rotation.

In Example 11, the subject matter of any one of Examples 8-10 can optionally include a rotational position sensor to determine a rotational position of the hinge assembly.

In Example 12, the subject matter of any one of Examples 8-11 can optionally include a sensor to determine a torque level of the hinge assembly.

In Example 13, the subject matter of any one of Examples 8-12 can optionally include an arrangement in which the EAP actuator expands in response to the signal to the signal from the controller.

In Example 14, the subject matter of any one of Examples 8-13 can optionally include an arrangement in which the EAP actuator contracts in response to the signal to the signal from the controller.

Example 15 is an electronic device, comprising a controller, a chassis comprising a first section and a second section, and a hinge assembly to connect the first section of the chassis to the second section of the chassis, comprising a shaft rotatable about a first axis, a brake selectively engageable with a portion of the shaft, and an electroactive polymer (EAP) actuator coupled to the brake, wherein the EAP actuator selectively engages the brake with a portion of the shaft in response to a signal from the controller.

In Example 16, the subject matter of Example 15 can optionally include an arrangement in which the EAP actuator applies a pressure to the brake which varies across a range of angular rotation.

In Example 17, the subject matter of any one of Examples 15-16 can optionally include an arrangement in which the EAP actuator varies the pressure applied to the brake to achieve a predetermined torque profile across the range of angular rotation.

In Example 18, the subject matter of any one of Examples 15-17 can optionally include a rotational position sensor to determine a rotational position of the hinge assembly.

In Example 19, the subject matter of any one of Examples 15-18 can optionally include a sensor to determine a torque level of the hinge assembly.

In Example 20, the subject matter of any one of Examples 15-19 can optionally include an arrangement in which the EAP actuator expands in response to the signal to the signal from the controller.

In Example 21, the subject matter of any one of Examples 15-20 can optionally include an arrangement in which the EAP actuator contracts in response to the signal to the signal from the controller.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A controller for an electronic device, comprising logic, at least partially including hardware logic, to:
   receive a torque/position profile for a hinge assembly of the electronic device;
   store the torque/position profile in a memory communicatively coupled to the controller;
   receive a rotational position of the hinge assembly;
   receive torque information for the hinge assembly;
   determine, from the torque/position profile, a torque corresponding to the rotational position; and
   selectively actuate an electroactive polymer (EAP) actuator coupled to a brake assembly to generate the torque corresponding to the rotational position.

2. The controller of claim 1, wherein the rotational position information is received from a rotational position sensor to determine a rotational position of the shaft about the first axis, wherein the rotational position sensor is communicatively coupled to the controller.

3. The controller of claim 1, wherein the EAP actuator selectively engages the brake with a portion of the shaft in response to a signal from the controller in order to apply a pressure to the brake which varies across a range of angular rotation of the shaft about the first axis to achieve a predetermined torque profile across the range of angular rotation in response to a signal from a controller.

4. The controller of claim 1, further comprising logic, at least partially including hardware logic, to:
   configure the EAP actuator to apply a pressure to the brake which varies across a range of angular rotation.

5. The controller of claim 1, wherein:
   the EAP actuator expands in response to the signal to the signal from the controller.

6. The controller of claim 1, wherein:
   the EAP actuator contracts in response to the signal to the signal from the controller.

7. An electronic device, comprising:
   a chassis comprising a first section and a second section; and
   a hinge assembly to connect the first section of the chassis to the second section of the chassis, comprising:
      a shaft rotatable about a first axis;
      a brake selectively engageable with a portion of the shaft; and
      an electroactive polymer (EAP) actuator coupled to the brake, wherein the EAP actuator selectively engages the brake with a portion of the shaft in response to a signal from the controller; and
   a controller comprising logic, at least partially including hardware logic, to:
      receive a torque/position profile for the hinge assembly;
      store the torque/position profile in a memory communicatively coupled to the controller;
      receive a rotational position of the hinge assembly;
      receive torque information for the hinge assembly;
      determine, from the torque/position profile, a torque corresponding to the rotational position; and
      selectively actuate the electroactive polymer (EAP) actuator coupled to a brake assembly to generate the torque corresponding to the rotational position.

8. The electronic device of claim 7, wherein the rotational position information is received from a rotational position sensor to determine a rotational position of the shaft about the first axis, wherein the rotational position sensor is communicatively coupled to the controller.

9. The electronic device of claim 7, wherein the EAP actuator selectively engages the brake with a portion of the shaft in response to a signal from the controller in order to apply a pressure to the brake which varies across a range of angular rotation of the shaft about the first axis to achieve a predetermined torque profile across the range of angular rotation in response to a signal from a controller.

10. The electronic device of claim 7, wherein the controller further comprises logic, at least partially including hardware logic, to:
    configure the EAP actuator to apply a pressure to the brake which varies across a range of angular rotation.

11. The electronic device of claim 7, wherein:
    the EAP actuator expands in response to the signal to the signal from the controller.

12. The electronic device of claim 7, wherein:
    the EAP actuator contracts in response to the signal to the signal from the controller.

13. A method to manage a torque for a hinge on an electronic device, comprising:
- receiving, in a controller of the electronic device, a torque/position profile for a hinge assembly of the electronic device;
- storing the torque/position profile in a memory communicatively coupled to the controller;
- receiving, in the controller, a rotational position of the hinge assembly;
- receiving, in the controller, torque information for the hinge assembly;
- determining, from the torque/position profile, a torque corresponding to the rotational position; and
- selectively actuating an electroactive polymer (EAP) actuator coupled to a brake assembly to generate the torque corresponding to the rotational position.

14. The method of claim 13, wherein the rotational position information is received from a rotational position sensor to determine a rotational position of the shaft about the first axis, wherein the rotational position sensor is communicatively coupled to the controller.

15. The method of claim 13, wherein the EAP actuator selectively engages the brake with a portion of the shaft in response to a signal from the controller in order to apply a pressure to the brake which varies across a range of angular rotation of the shaft about the first axis to achieve a predetermined torque profile across the range of angular rotation in response to a signal from a controller.

16. The method of claim 13, further comprising logic, at least partially including hardware logic, to:
- configure the EAP actuator to apply a pressure to the brake which varies across a range of angular rotation.

17. The method of claim 13, wherein:
- the EAP actuator expands in response to the signal to the signal from the controller.

18. The method of claim 13, wherein:
- the EAP actuator contracts in response to the signal to the signal from the controller.

* * * * *